United States Patent
Huang et al.

(10) Patent No.: US 9,516,756 B2
(45) Date of Patent: Dec. 6, 2016

(54) CIRCUIT MODULE SYSTEM

(71) Applicant: EZEK LAB COMPANY LIMITED, Taipei (TW)

(72) Inventors: Sheng-Che Huang, Taipei (TW); Yu-Tse Liu, New Taipei (TW); Wei-Han Hu, New Taipei (TW); Chien-Hung Lee, New Taipei (TW)

(73) Assignee: EZEK LAB COMPANY LIMITED, Taipei (TW)

( * ) Notice: Subject to any disclaimer, the term of this patent is extended or adjusted under 35 U.S.C. 154(b) by 172 days.

(21) Appl. No.: 14/583,145

(22) Filed: Dec. 25, 2014

(65) Prior Publication Data

US 2016/0192492 A1    Jun. 30, 2016

(51) Int. Cl.
*H05K 1/11*    (2006.01)
*H05K 1/14*    (2006.01)
*H01R 12/71*   (2011.01)

(52) U.S. Cl.
CPC ............ *H05K 1/144* (2013.01); *H01R 12/718* (2013.01)

(58) Field of Classification Search
None
See application file for complete search history.

(56) References Cited

U.S. PATENT DOCUMENTS

| 2003/0002268 | A1* | 1/2003 | Dibene, II | G06F 1/18 361/784 |
| 2006/0211388 | A1* | 9/2006 | Lambert | G06F 1/184 455/131 |
| 2008/0139013 | A1* | 6/2008 | Tomura | H05K 3/368 439/65 |
| 2013/0343025 | A1 | 12/2013 | Bdeir | |
| 2014/0218883 | A1* | 8/2014 | Dakhiya | H01L 25/0652 361/761 |

* cited by examiner

*Primary Examiner* — Yuriy Semenenko
(74) *Attorney, Agent, or Firm* — Chun-Ming Shih

(57) ABSTRACT

A circuit module system includes a first and a second circuit module, the first circuit module includes a first circuit board and a first connecting housing, the first connecting housing includes a first base connected to a side of the first circuit board and at least one first conductor. A top surface of the first base forms a fillister connecting to outside, the first conductor is clamped on the first base and electrically connects the first circuit board to outside. The second circuit module includes a second circuit board and a second connecting housing, the second connecting housing includes a second base connected to a side of the second circuit board and at least one second conductor. A protruding part protrudes from an outer side of the second base, the second conductor is clamped on the second base and electrically connects the second circuit board to outside.

12 Claims, 10 Drawing Sheets

CIRCUIT MODULE SYSTEM

BACKGROUND

1. Technical Field

The technical field relates to a circuit module, particularly to a scalable stackable circuit module system where the circuit modules are not easy to detach from one another.

2. Related Art

The US patent US 2013/0343025 A1 discloses the most common circuit module system used for teaching purpose, and a plurality of circuit modules can be connected by serial connection. The connection way of this patent provides magnets on ends of each of the circuit modules, and those circuit modules are connected by the magnets.

However, since the connecting force of the magnets is limited, so the modules are easy to separate when there are plenty of circuit modules connected together, they always causes frustration in using and teaching.

Moreover, the magnets are a added cost and the magnets are disposed in a burying way, which increases the difficulties in manufacturing as well, i.e. low yield rate.

In addition, the aforementioned circuit module system can only serially connects the circuit module units, and the vertically stacking and side connection of the circuit modules cannot be achieved. Therefore, the application and the variability are very limited. Furthermore, with more and more circuit module units are connected, the space for placing those connected circuit modules is getting larger, which may take too many space in your creation.

BRIEF SUMMARY

In order to improve the aforementioned problems, one of the exemplary embodiments according to the present invention is to provide a circuit module system, which includes a first circuit module including a first circuit board and a first connecting housing, the first connecting housing includes a first base and at least one first conductor, the first base is connected to a side of the first circuit board, the at least one first conductor is clamped on the first base and electrically connected with the first circuit board, the first conductor electrically connects the first circuit board to outside, a top surface of the first base is concaved to formed a fillister, the fillister is provided with a side opening, the fillister connects to outside through the side opening, a width of the fillister is larger than a width of the side opening; a second circuit module includes a second circuit board and a second connecting housing, the second connecting housing includes a second base and at least one second conductor, the second base is connected to a side of the second circuit board, the at least one second conductor is clamped on the second base and electrically connected with the second circuit board, the second conductor electrically connects the first circuit board to outside, a protruding part protruded from an outer side of the second base and is corresponding to the fillister, the protruding part is provided with a base part, a width of the protruding part is larger than a width of the base part, wherein the protruding part of the second circuit module is inserted into the fillister of the first circuit module from top to bottom, the second circuit module is connected and fixed to the first circuit module, and the second conductor electrically contacts the first conductor to connect the first circuit board and the second circuit board together. By this connecting method, the detaching of the circuit modules connected in serial can be prevented, and the connected circuit modules will not easily detach from one another due to the weight of the circuit modules when being lifted up.

The aforementioned circuit module system, wherein the first conductor includes a first circuit board connecting terminal and a first exterior contact terminal, the first circuit board connecting terminal inserts into the first circuit board, the first exterior contact terminal is exposed to an outer side of the first base; the second conductor includes a second circuit board connecting terminal and a second exterior contact terminal, the second circuit board connecting terminal inserts into the second circuit board, the second exterior contact terminal is exposed to an outer side of the second base.

The aforementioned circuit module system, wherein the first circuit board includes an electrical terminal hole, the first circuit connecting terminal is inserted into the electrical terminal hole; the second circuit board includes another electrical terminal hole, the second circuit connecting terminal is inserted into the another electrical terminal hole.

The aforementioned circuit module system, wherein the first base includes a first fixing element and a first connector, and an accommodating space is provided therein, a bottom of the accommodating space is provided with a bottom hole, and a side of the accommodating space is provided with a side hole, the accommodating space communicates with outside by the bottom hole and the side hole, the first conductor is accommodated inside the accommodating space, the first circuit board connecting terminal is protruded from the bottom hole, the first exterior contact terminal is exposed to the side hole; the second base includes a second fixing element and a second connector, and another accommodating space is provided therein, a bottom of the another accommodating space is provided with a bottom hole, and a side of the another accommodating space is provided with a side hole, the another accommodating space communicates with outside by the bottom hole and the side hole, the second conductor is accommodated inside the another accommodating space, the second circuit board connecting terminal is protruded from the bottom hole, the second exterior contact terminal is exposed to the side hole.

The aforementioned circuit module system, wherein the first circuit board is provided with at least one connecting hole, the first base is consisted of a first fixing element and a first connector, the first conductor is limited to be fixed between the first fixing element and the first connector, a bottom of the first fixing element is provided with a plurality of first insertion columns, the plurality of the first insertion columns insert into the at least one connecting hole of the first circuit board, the fillister is formed by concaving from a top surface of the first connector; the second circuit board is provided with at least one connecting hole, the second base is consisted of a second fixing element and a second connector, the second conductor is limited to be fixed between the second fixing element and the second connector, a bottom of the second fixing element is provided with a plurality of second insertion columns, the plurality of the second insertion columns insert into the at least one connecting hole of the second circuit board, the protruding part is formed by protruding from an outer side of the second connector.

The aforementioned circuit module system, wherein the first circuit module includes a third connecting housing connected to another side of the first circuit board, a structure of the third connecting housing is identical to a structure of the second connecting housing of the second circuit module, the second circuit module further includes a fourth connecting housing connected to another side of the second circuit board, a structure of the fourth connecting housing is identical to a structure of the first connecting housing of the first circuit module.

The aforementioned circuit module system, wherein at least one first slider protrudes from a top surface of the first connecting housing, at least one first chute is concaved to form on a bottom surface of the first connecting housing, the first chute is positioned corresponding to the first slider; at least one second slider protrudes from a top surface of the second connecting housing, at least one second chute is concaved to form on a bottom surface of the second connecting housing, the second chute is positioned corresponding to the second slider; by a connection of the first slider and the second chute or a connection of the second slider and the first chute, the first circuit module and the second circuit module, or the first circuit module and another first circuit module, or even the second circuit module and another second circuit module can be connected or stacked together.

The aforementioned circuit module system, further includes at least one bridging plate, a bottom surface of the bridging plate is concaved to form two bridging chutes parallelly, a top surface of the bridging plate protrudes two bridging sliders parallelly, each of the bridging sliders is corresponding to each of the bridging chutes, each of the bridging sliders slides in chutes of two adjacent circuit modules, each of the bridging chutes is provided for two sliders of two circuit modules to slide thereon, the first circuit module and the second circuit module, or the first circuit module and the another first circuit module, or even the second circuit module and the another second circuit module connect to each other laterally.

The aforementioned circuit module system, wherein the first circuit board and the second circuit board are provided with a socket respectively, a cable having two plugs at two opposite ends thereof is provided for connecting to the socket of each of circuit boards.

The aforementioned circuit module system, wherein the first circuit board and the second circuit board are provided with a socket respectively, a cable having two plugs at two opposite ends thereof is provided for connecting to the socket of each of circuit boards.

The aforementioned circuit module system, further includes at least one bridging plate, a bottom surface of the bridging plate is concaved to form two bridging chutes parallelly, a top surface of the bridging plate protrudes two bridging sliders parallelly, each of the bridging sliders is corresponding to each of the bridging chutes, each of the bridging sliders slides in chutes of two adjacent circuit modules, each of the bridging chutes is provided for two sliders of two circuit modules to slide thereon, the first circuit module and the second circuit module, or the first circuit module and the another first circuit module, or even the second circuit module and the another second circuit module connect to each other laterally.

The aforementioned circuit module system, wherein the first circuit board and the second circuit board are provided with a socket respectively, a cable having two plugs at two opposite ends thereof is provided for connecting to the socket of each of circuit boards.

The exemplary embodiment of the present invention has the advantages, such as three dimensionally stacking and connecting, low manufacturing cost, easily design and manufacture, and strong detachment even hanging vertically. By the vertical stacking and lateral connection, the conventional serial connection which takes a lot of spaces can be prevented, and interfering with other adjacent element no longer exists. Due to varieties of combinations, new modules can easily to be developed to expend the circuit module system.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
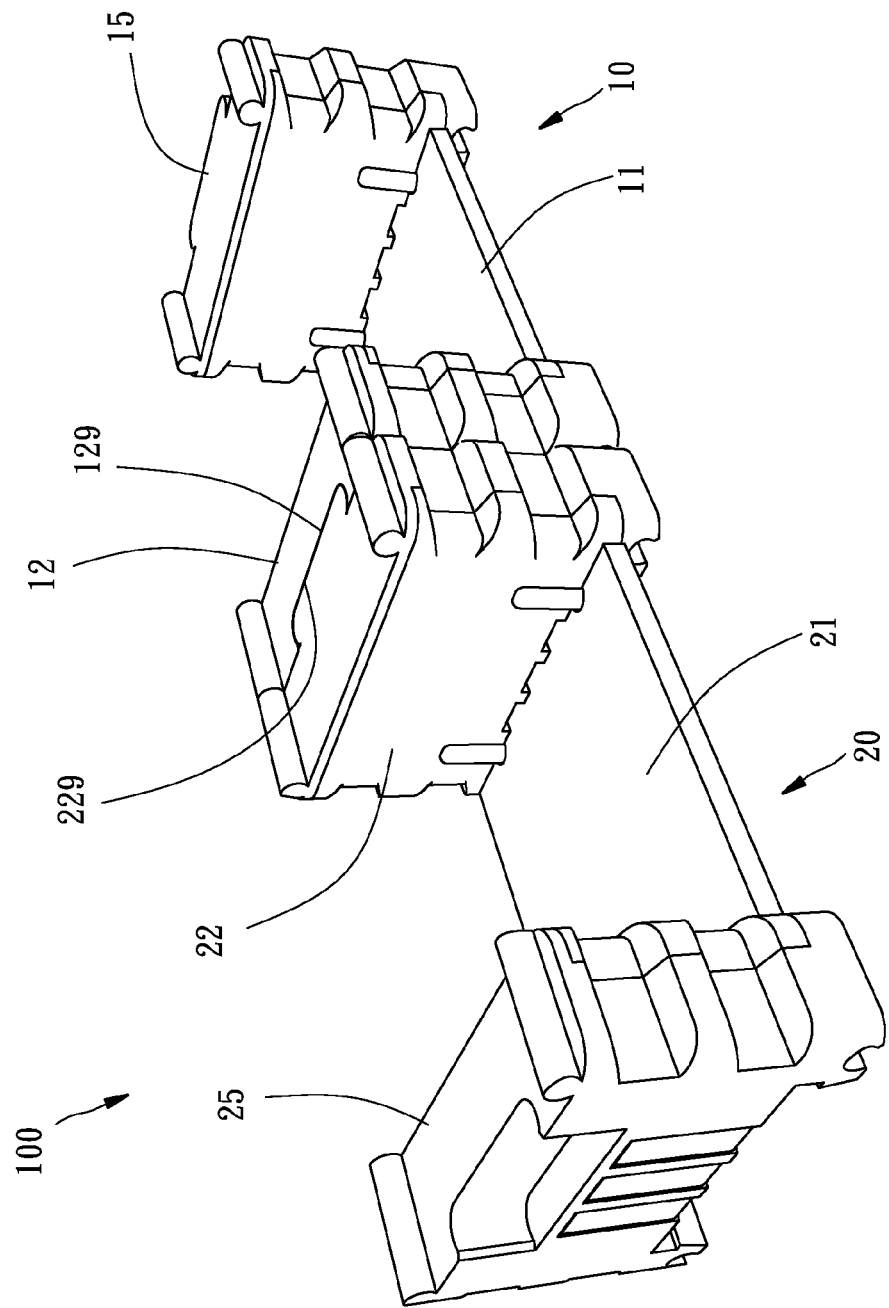
FIG. 1 is a three-dimensional assembly diagram of one of the preferred embodiments according to the present invention.
Figure 2:
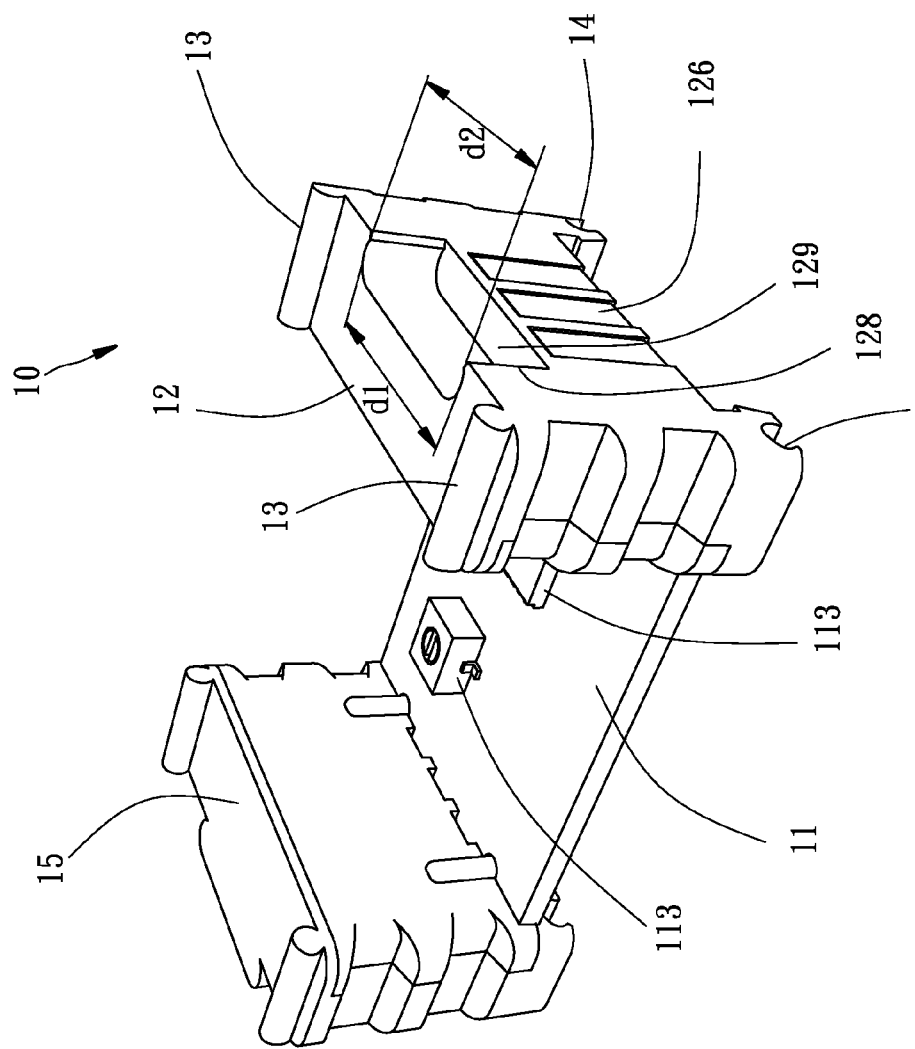
FIG. 2 is a three-dimensional assembly diagram of partial assemblies of FIG. 1.

Referring to FIGS. 1-10, one of the exemplary embodiments of the present invention provides a circuit module system 100, which includes a first circuit module 10 and a second circuit module 20.

Referring to FIGS. 1-4, in one of the exemplary embodiments, the first circuit module 10 includes a first circuit board 11 and a first connecting housing 12. The first connecting housing 12 includes a first base 121 and at least one first conductor 122. The first base 121 is connected to one side of the first circuit board 11, and the at least one first conductor 122 is clamped on the first base 121. The first conductor 122 electrically connects the first circuit board 11 to outside.

In one of the exemplary embodiments, the first circuit board 11 is provided with a conductor circuit (not shown in the FIGS.) connecting electric component 113. The first circuit board 11 is provided with a connecting hole 111 and an electrical terminal hole 112. The electrical terminal hole 112 is electrically connected to a circuit of the first circuit board 11 (not shown in the FIGS.), and the electricity or signals from the first circuit board 11 are connected to the electrical terminal hole 112 for electrical outlet.

Figure 3:
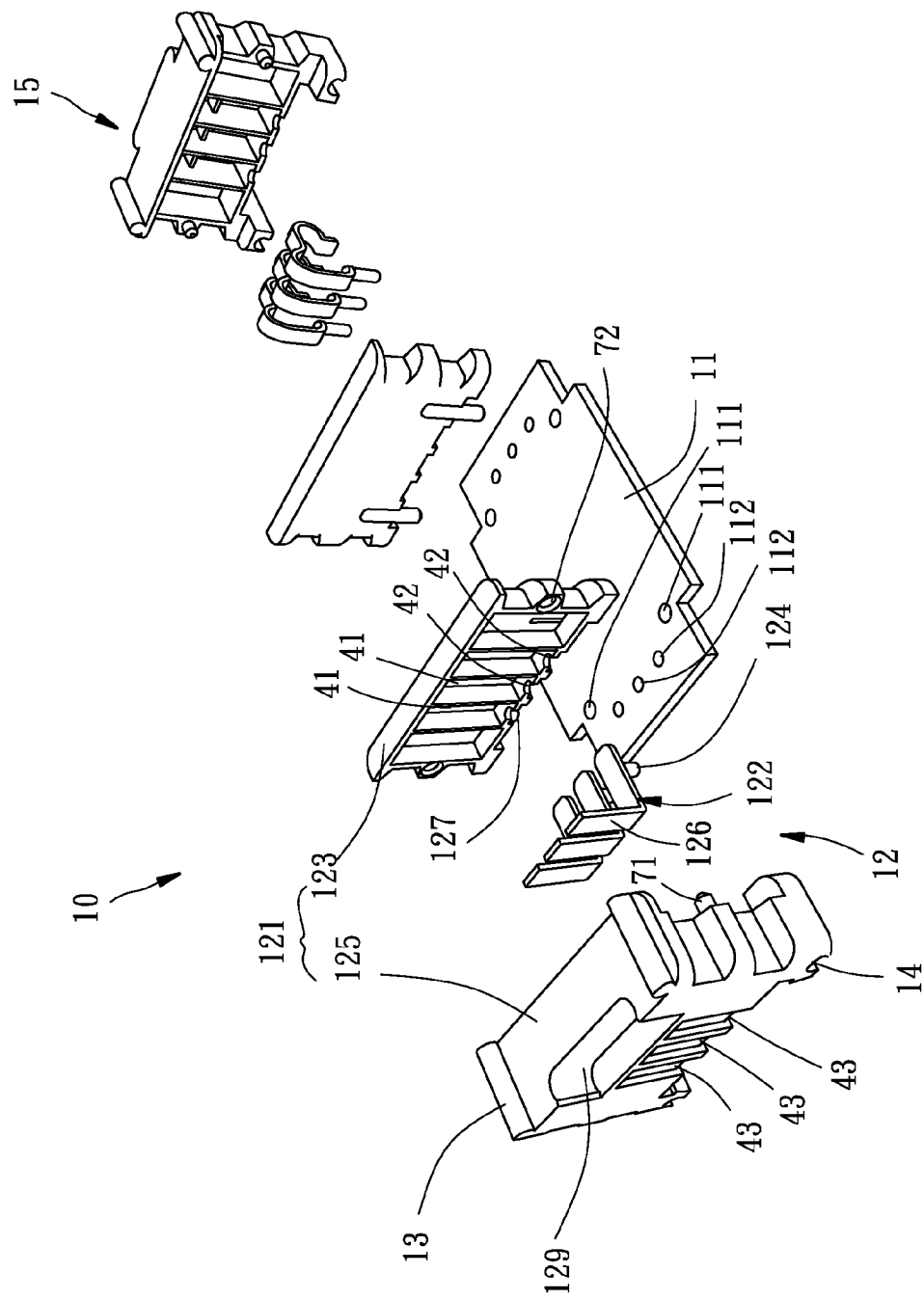
FIG. 3 is a three-dimensional exploded view of partial assemblies of FIG. 1.
Figure 4:
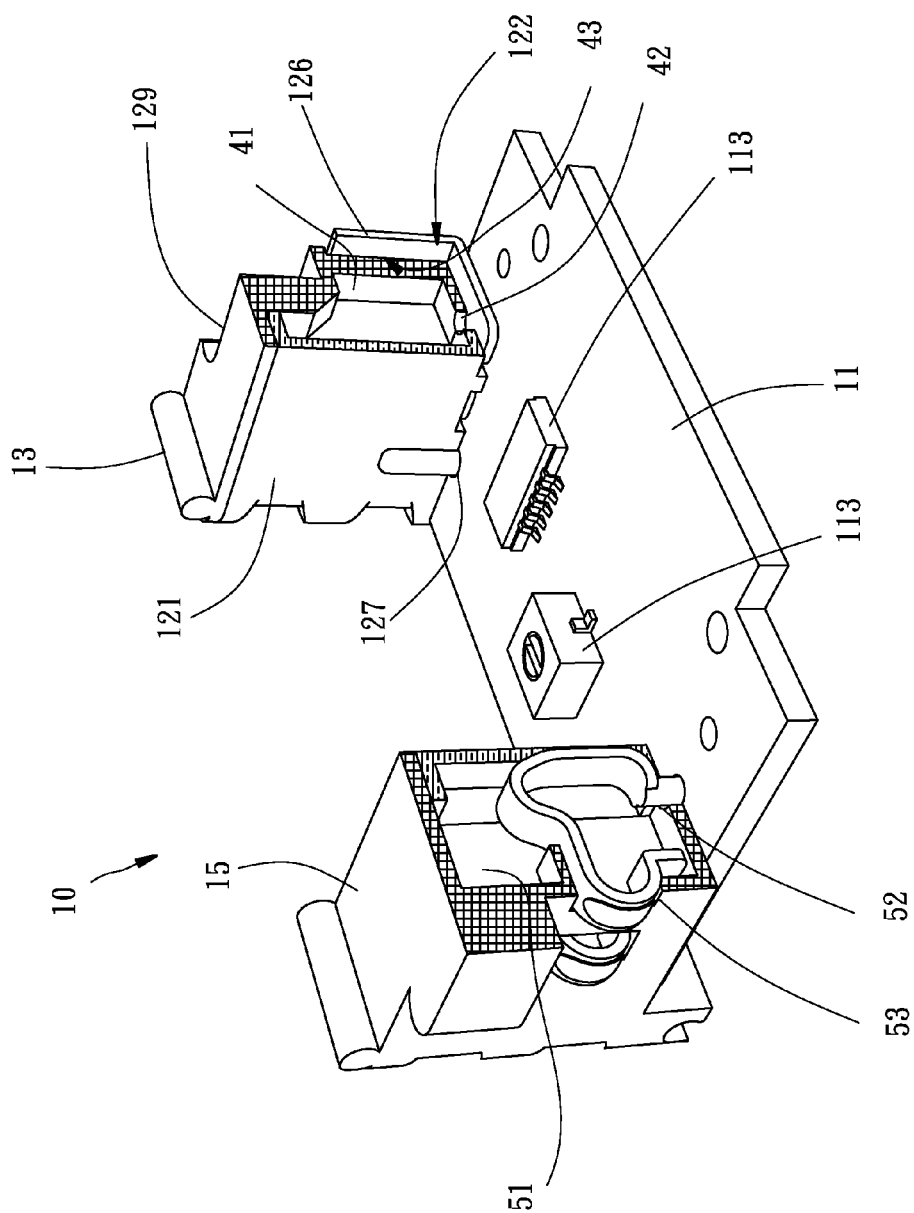
FIG. 4 is a three-dimensional and partial perspective view of partial assemblies of FIG. 1.
Figure 5:
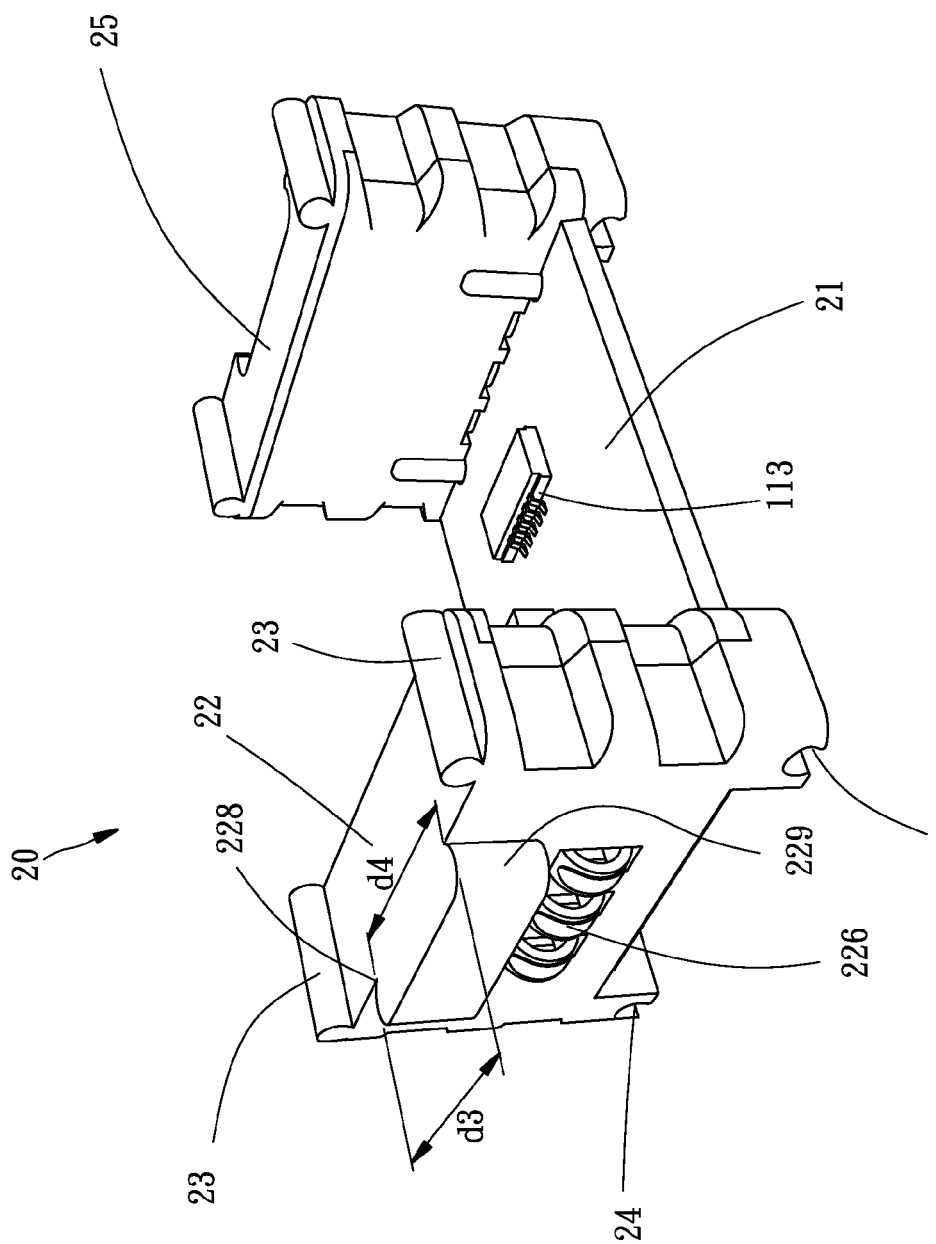
FIG. 5 is a three-dimensional assembly diagram of partial assemblies of FIG. 1 (opposite direction of FIG. 2)

In one of the exemplary embodiments, the first base 121 is consisted of a first fixing element 123 and a first connector 125. FIG. 3 shows the first base 121 is fixed by a tenon 71 and a tenon hole 72, and there is a plurality of accommodating spaces 41 provided therein. The bottom of the accommodating space 41 is provided with a bottom hole 42, and the side of the accommodating space 41 is provided with a side hole 43. The plurality of accommodating spaces are connected to outside through the bottom hole 42 and the side hole 43. A plurality of first insertion columns 127 is provided on a bottom of the first fixing element 123, and the plurality of first insertion columns 127 is inserted into the connecting hole 111 of the first circuit board 11. A fillister 129 is formed on a top surface of the first connector 125 of the first base 121. The fillister 129 has a side opening 128, and the fillister 129 communicates with outside through the side opening 128. A width d1 of the fillister 129 is larger than a width d2 of the side opening 128. The fillister 129 of the exemplary embodiment of the present invention is disposed above the side hole 43, and of course, the fillister 129 can also be disposed above both sides of the side hole 43.

In one of the exemplary embodiments, the first conductor 122 is accommodated in the accommodating space 41 of the first base 121, and the first conductor 122 has a first circuit board connecting terminal 124 and a first exterior contact terminal 126. The first circuit board connecting terminal 124 is protruded from the bottom hole 42 and inserted into the electrical terminal hole 112 of the first circuit board 11 to be electrically connected to the first circuit board 11. The first exterior contact terminal 126 protrudes outside the side hole 43 of the first base 121.

Referring to FIGS. 1 and 5-7. In one exemplary embodiment of the present invention, the second circuit board module 20 includes a second circuit board 21 and a second connecting housing 22. The second connecting housing 22 includes a second base 221 and at least one second conductor 222. The second base 221 is connected to one side of the second circuit board 21, and the at least one second conductor 222 is clamped on the second base 221. The second conductor 222 electrically connects the second circuit board 21 to outside.

In one of the exemplary embodiments, the second circuit board 21 is provided with a conductor circuit (not shown in the FIGS.) connecting electric component 113. The second circuit board 21 is provided with a connecting hole 211 and an electrical terminal hole 212. The electrical terminal hole 212 is electrically connected to a circuit of the second circuit board 21 (not shown in the FIGS.), and the electricity or signals from the second circuit board 21 are connected to the electrical terminal hole 212 for electrical outlet.

Figure 6:
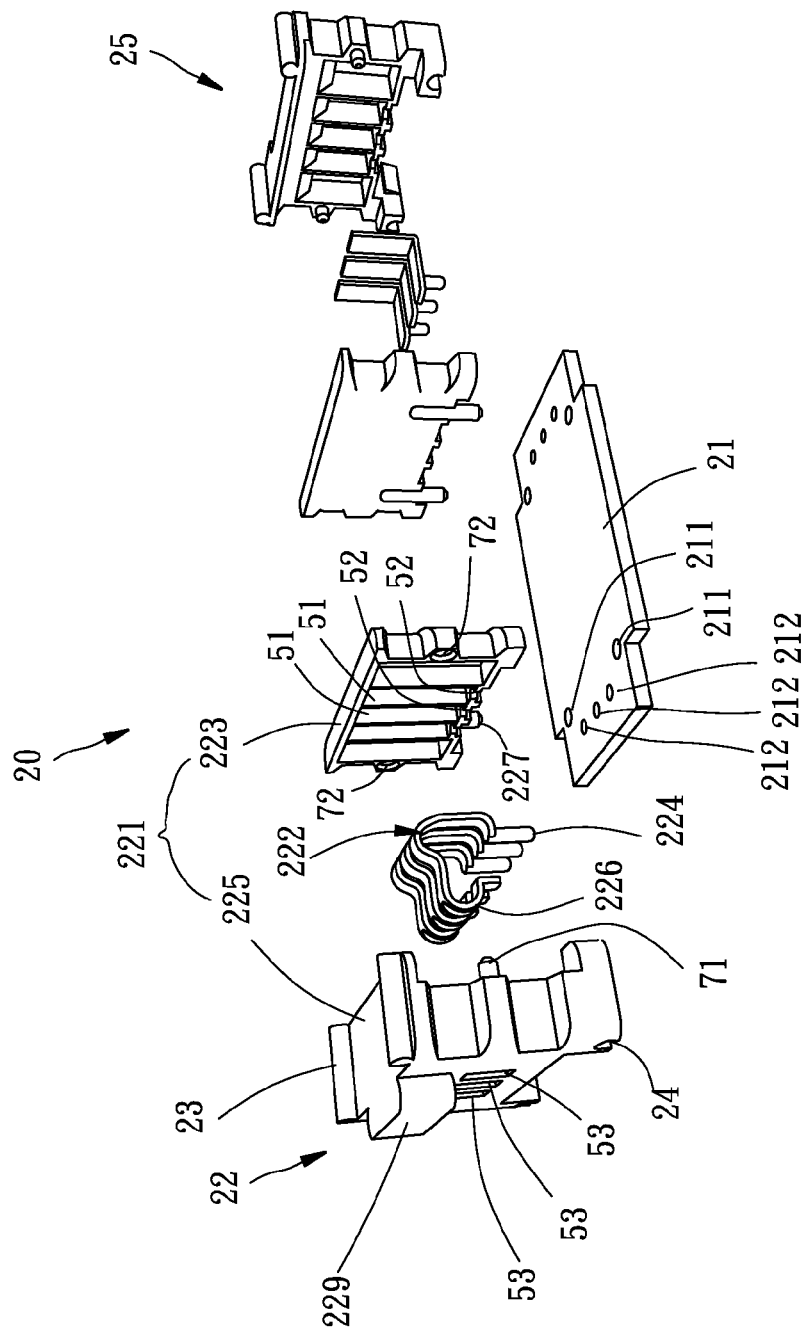
FIG. 6 is a three-dimensional exploded view of partial assemblies of FIG. 1.
Figure 7:
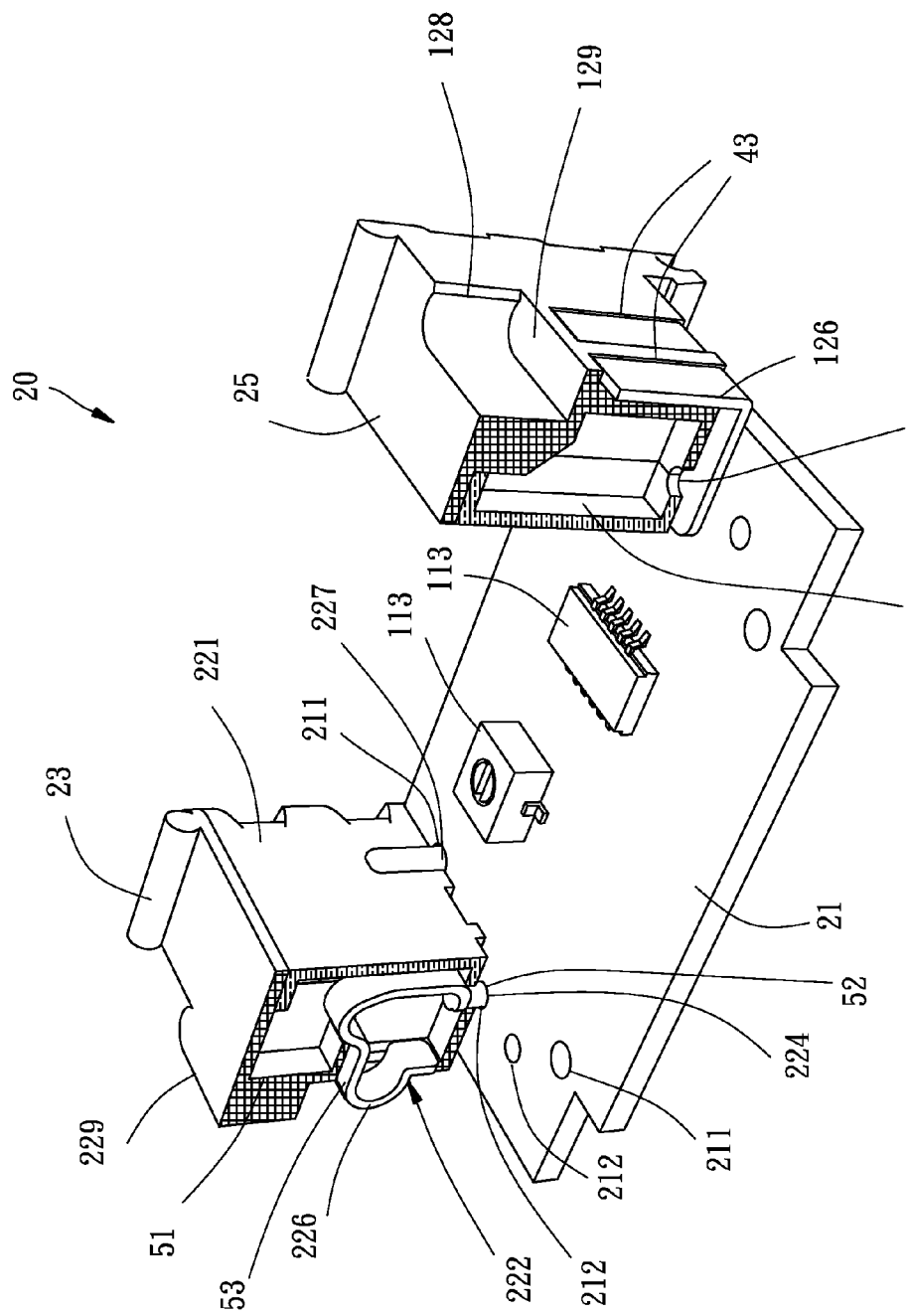
FIG. 7 is a three-dimensional and partial perspective view of partial assemblies of FIG. 1.

In one of the exemplary embodiments, the second base 221 is consisted of a second fixing element 223 and a second connector 225. FIG. 6 shows the second base 221 is fixed by a tenon 71 and a tenon hole 72, and there is a plurality of accommodating spaces 51 provided therein. The bottom of the accommodating space 51 is provided with a bottom hole 52, and the side of the accommodating space 51 is provided with a side hole 53. The plurality of accommodating spaces are connected to outside through the bottom hole 52 and the side hole 53. A plurality of second insertion columns 227 is provided on a bottom of the second fixing element 223, and the plurality of second insertion columns 227 is inserted into the connecting hole 211 of the second circuit board 21. A protruding part 229 corresponding to the fillister 129 protrudes from an outer side of the second connector 225 of the second base 221. The protruding part 229 has a base part 228, and a width d3 of the protruding part 229 is larger than a width d4 of the base part 228. The protruding part 229 of the exemplary embodiment of the present invention is formed above the side hole 53, and of course, the protruding part 229 can also be disposed above both sides of the side hole 53, or a position corresponding to the fillister 129.

In one of the exemplary embodiments, the second conductor 222 is accommodated in the accommodating space 51 of the second base 221, and the second conductor 222 has a second circuit board connecting terminal 224 and a second exterior contact terminal 226. The second circuit board connecting terminal 224 is protruded from the bottom hole 52 and inserted into the electrical terminal hole 212 of the second circuit board 21 to be electrically connected to the second circuit board 21. The second exterior contact terminal 226 protrudes outside the side hole 53 of the second base 221, and the second exterior contact terminal 226 is an elastomer.

The aforementioned is an exemplary embodiment of the present invention showing a circuit module system 100 and all the parts thereof. Following shows the assembly method and the features.

First, when assembling the first circuit module 10 with the second circuit module 20, the protruding part 229 of the second circuit module 20 is inserted into the fillister 129 of the first circuit module 10 from top to bottom, and thus the first circuit module 10 and the second circuit module 20 can be connected in serial. The first exterior contact terminal 126 of the first conductor 122 contacts the second exterior contact terminal 226 of the second conductor 222 to form an electrical connection. Since the first circuit module 10 and the second circuit module 20 are connected by inserting the protruding part 229 into the fillister 129 from top to bottom, the first circuit module 10 and the second circuit module 20 will not detach from each other toward an opposite direction, which can prevent the circuit modules detaching from each other when the circuit modules are vertically hung. Besides, the fillister 129 of the first circuit module 10 is integrally formed in one piece with the first base 121, and the protruding part 229 of the second module 20 is integrally formed in one piece with the second base 221. Therefore, it is easy in manufacturing and is low in cost, and the polarity of the magnet can be ignored.

Referring to FIGS. 1-7, the circuit module system 100 of an exemplary embodiment of the present invention, at least one first slider 13 is protruded from a top surface of the first connecting housing 12 of the first circuit module 10, and at least one first chute 14 is formed on a bottom surface of the first connecting housing 12. The first chute 14 is disposed at a position corresponding to the first slider 13. At least one second slider 23 is protruded from a top surface of the second connecting housing 22 of the second circuit module 20, and at least one second chute 24 is formed on a bottom surface of the second connecting housing 22. The second chute 24 is disposed at a position corresponding to the second slider 23.

Figure 8:
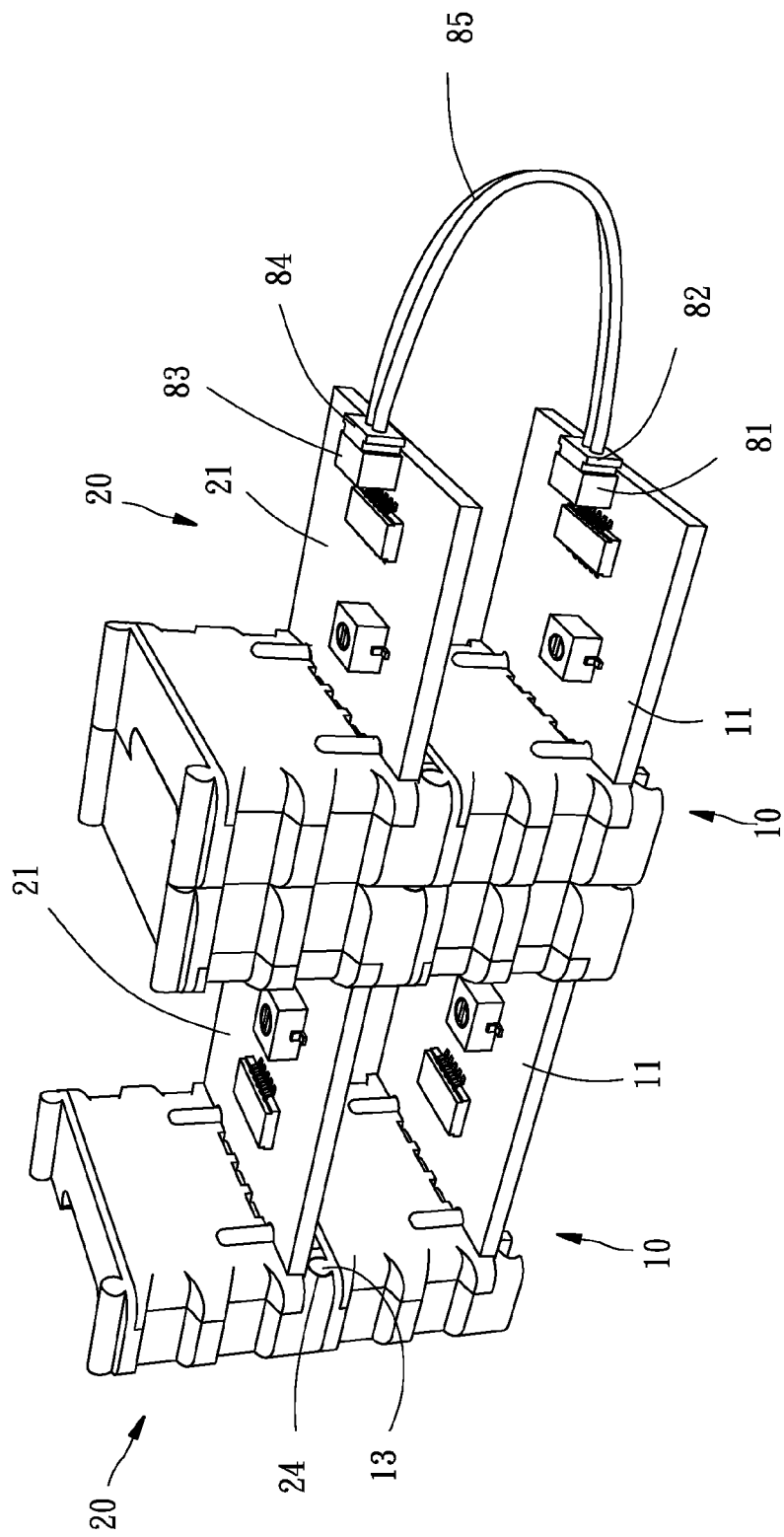
FIG. 8 is a usage schematic diagram of FIG. 1.

By this arrangement, as shown in FIG. 8, the first slider 13 of the first circuit module 10 can slide into the second chute 24 of the second circuit module 20 to allow the first circuit module 10 and the second circuit module 20 disposing in a stacking manner. Therefore, not only the length of the connected circuit modules can be decreased, the variation of the connecting type of the circuit modules can also be achieved. By the connection of the first slider 13 and the second chute 24, or the first chute 14 and the second slider 23, the first circuit module 10 and the second circuit module 20, or the first circuit module 10 and another first circuit module 10, or even the second circuit module 20 and another second circuit module 20 can be connected or stacked together Besides, in the aforementioned embodiment, as shown in FIGS. 1-4, the first circuit module 10 further includes a third connecting housing 15. The third connecting housing 15 is connected to another side of the first circuit board 11. Since the structure of the third connecting housing 15 is identical to the second connecting housing 22 of the second circuit module 20, it is not further described hereinafter. The third connecting housing 15 can be used to increase the quantity of the circuit module.

Besides, in the aforementioned embodiment, as shown in FIGS. 1 and 5-7, the second circuit module 20 further includes a fourth connecting housing 25. The fourth connecting housing 25 is connected to another side of the second circuit board 21. Since the structure of the fourth connecting housing 25 is identical to the first connecting housing 12 of the first circuit module 10, it is not further described hereinafter. The fourth connecting housing 25 can be used to increase the quantity of the circuit module.

Figure 9:
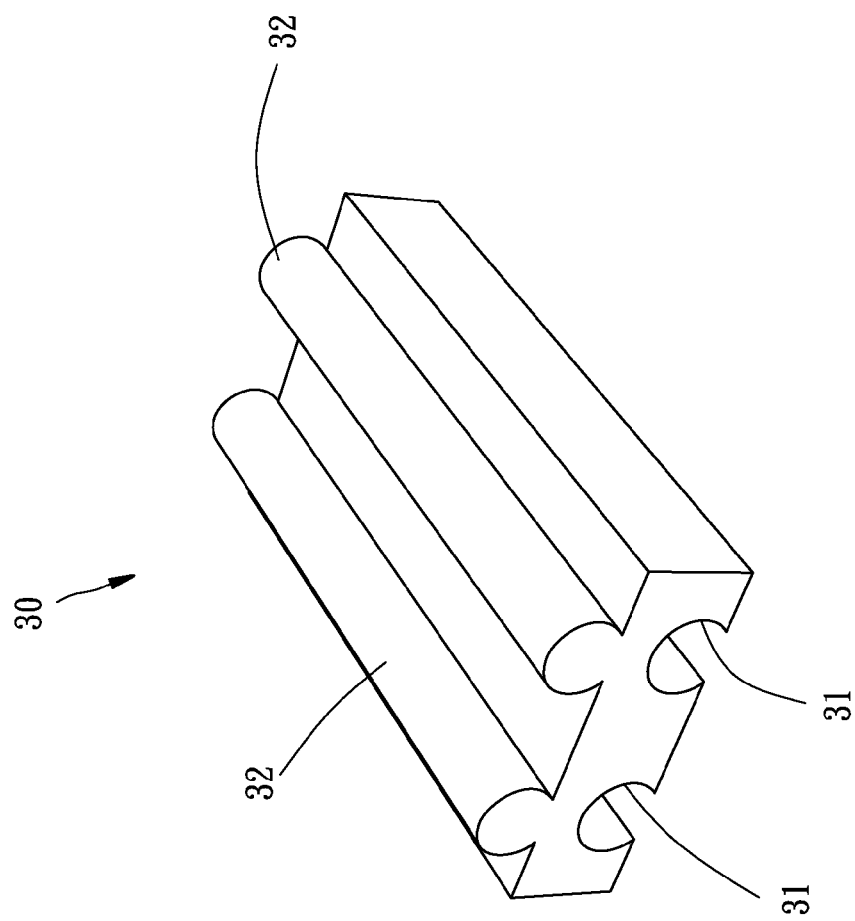
FIG. 9 is a three-dimensional diagram of a bridging plate of a preferred embodiment according to the present invention.

In one exemplary embodiment of the present invention, the circuit module system 100 further includes at least one bridging plate 30, as shown in FIG. 9. A bottom surface of the bridging plate 30 is concaved to form two bridging chutes 31 parallelly, and a top surface of the bridging plate 30 protrudes two bridging sliders 32 parallelly. Each of the bridging sliders 32 is corresponding to each of the bridging chutes 31.

Figure 10:
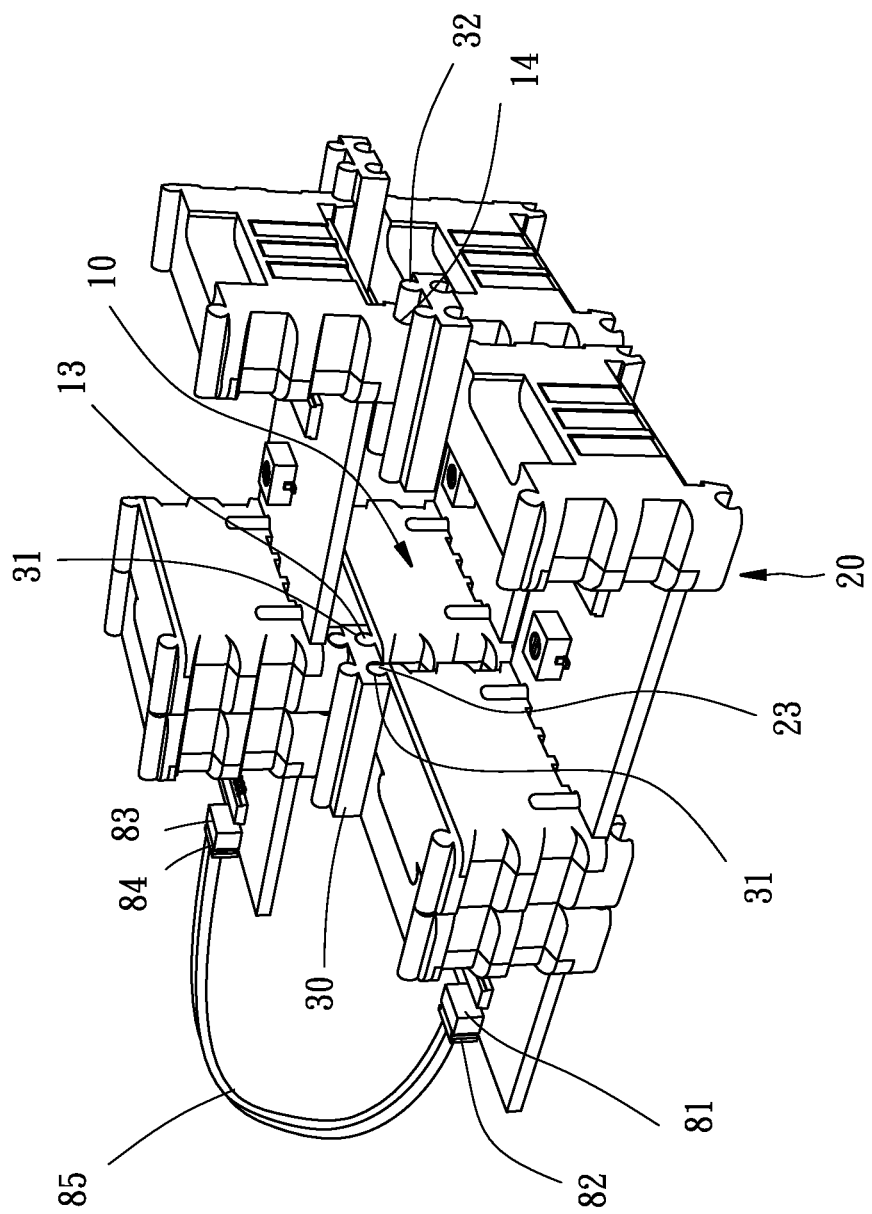
FIG. 10 is a usage schematic diagram of a preferred embodiment according to the present invention.

By this arrangement, as shown in FIG. 10, the two bridging chutes 31 of the bridging plate 30 can be provided for the sliders 13 of the first circuit module 10 and the slider 23 of the second module 20 to slide thereon, and thus the first circuit module 10 and the second circuit module 20 can be connected parallelly. Of course, the two sliders 32 of the bridging plate 30 can also slide in the first chute 14 of the first circuit module 10 and the second chute 24 of the second circuit module 20, respectively, and the parallel connection can be also achieved. Therefore, the first circuit module 10 and the second circuit module 20, or the first circuit module 10 and the another first circuit module 10, or even the second circuit module 20 and the another second circuit module 20 can connect to each other laterally Referring to FIG. 8, in one exemplary embodiment of the present invention, a socket 81 is provided on the first circuit board 11, and the socket 81 is electrically connected to the first circuit board 11. A socket 83 is provided on the second circuit board 21, and the socket 83 is electrically connected to the second circuit board 21. Besides, a cable 85 having two plugs 82/84 at two opposite ends thereof is provided for connecting to the socket 81/83. The vertically-arranged first circuit board 11 and the second circuit board 21 can be electrically connected together, and this arrangement can also be used in a plane lateral connection or a stacking type lateral connection (as shown in FIG. 10).

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A circuit module system, comprising:
 a first circuit module including a first circuit board and a first connecting housing, the first connecting housing including a first base and at least one first conductor, the first base being connected to a side of the first circuit board, the at least one first conductor being clamped on the first base and electrically connected with the first circuit board, the first conductor electrically connecting the first circuit board to outside, a top surface of the first base concaved to formed a fillister, the fillister being provided with a side opening, the fillister being connecting to outside through the side opening, a width of the fillister being larger than a width of the side opening; and
 a second circuit module including a second circuit board and a second connecting housing, the second connecting housing including a second base and at least one second conductor, the second base being connected to a side of the second circuit board, the at least one second conductor being clamped on the second base and electrically connected with the second circuit board, the second conductor electrically connecting the first circuit board to outside, a protruding part protruded from an outer side of the second base and being corresponding to the fillister, the protruding part being provided with a base part, a width of the protruding part being larger than a width of the base part,
 wherein the protruding part of the second circuit module is inserted into the fillister of the first circuit module from top to bottom, the second circuit module is connected and fixed to the first circuit module, and the second conductor electrically contacts the first conductor to connect the first circuit board and the second circuit board together.

2. The circuit module system according to claim 1, wherein the first conductor includes a first circuit board connecting terminal and a first exterior contact terminal, the first circuit board connecting terminal inserts into the first circuit board, the first exterior contact terminal is exposed to an outer side of the first base; the second conductor includes a second circuit board connecting terminal and a second exterior contact terminal, the second circuit board connecting terminal inserts into the second circuit board, the second exterior contact terminal is exposed to an outer side of the second base.

3. The circuit module system according to claim 2, wherein the first circuit board includes an electrical terminal hole, the first circuit connecting terminal is inserted into the electrical terminal hole; the second circuit board includes another electrical terminal hole, the second circuit connecting terminal is inserted into the another electrical terminal hole.

4. The circuit module system according to claim 3, wherein the first base includes a first fixing element and a first connector, and an accommodating space is provided therein, a bottom of the accommodating space is provided with a bottom hole, and a side of the accommodating space is provided with a side hole, the accommodating space communicates with outside by the bottom hole and the side hole, the first conductor is accommodated inside the accommodating space, the first circuit board connecting terminal is protruded from the bottom hole, the first exterior contact terminal is exposed to the side hole; the second base includes a second fixing element and a second connector, and another accommodating space is provided therein, a bottom of the another accommodating space is provided with a bottom hole, and a side of the another accommodating space is provided with a side hole, the another accommodating space communicates with outside by the bottom hole and the side hole, the second conductor is accommodated inside the another accommodating space, the second circuit board connecting terminal is protruded from the bottom hole, the second exterior contact terminal is exposed to the side hole.

5. The circuit module system according to claim 1, wherein the first circuit board is provided with at least one connecting hole, the first base is consisted of a first fixing element and a first connector, the first conductor is limited to be fixed between the first fixing element and the first connector, a bottom of the first fixing element is provided with a plurality of first insertion columns, the plurality of the first insertion columns insert into the at least one connecting hole of the first circuit board, the fillister is formed by concaving from a top surface of the first connector; the second circuit board is provided with at least one connecting hole, the second base is consisted of a second fixing element and a second connector, the second conductor is limited to be fixed between the second fixing element and the second connector, a bottom of the second fixing element is provided with a plurality of second insertion columns, the plurality of the second insertion columns insert into the at least one connecting hole of the second circuit board, the protruding part is formed by protruding from an outer side of the second connector.

6. The circuit module system according to claim 1, wherein the first circuit module includes a third connecting housing connected to another side of the first circuit board, a structure of the third connecting housing is identical to a structure of the second connecting housing of the second circuit module, the second circuit module further includes a fourth connecting housing connected to another side of the second circuit board, a structure of the fourth connecting housing is identical to a structure of the first connecting housing of the first circuit module.

7. The circuit module system according to claim 1, wherein at least one first slider protrudes from a top surface of the first connecting housing, at least one first chute is concaved to form on a bottom surface of the first connecting housing, the first chute is positioned corresponding to the first slider; at least one second slider protrudes from a top surface of the second connecting housing, at least one second chute is concaved to form on a bottom surface of the second connecting housing, the second chute is positioned corresponding to the second slider; by a connection of the first slider and the second chute or a connection of the second slider and the first chute, the first circuit module and the second circuit module, or the first circuit module and another first circuit module, or even the second circuit module and another second circuit module can be connected or stacked together.

8. The circuit module system according to claim 7, further comprising at least one bridging plate, a bottom surface of the bridging plate being concaved to form two bridging chutes parallelly, a top surface of the bridging plate protruding two bridging sliders parallelly, each of the bridging sliders being corresponding to each of the bridging chutes, each of the bridging sliders sliding in chutes of two adjacent circuit modules, each of the bridging chutes being provided for two sliders of two circuit modules to slide thereon, the first circuit module and the second circuit module, or the first circuit module and the another first circuit module, or even the second circuit module and the another second circuit module connecting to each other laterally.

9. The circuit module system according to claim 7, wherein the first circuit board and the second circuit board are provided with a socket respectively, a cable having two plugs at two opposite ends thereof is provided for connecting to the socket of each of circuit boards.

10. The circuit module system according to claim 8, wherein the first circuit board and the second circuit board are provided with a socket respectively, a cable having two plugs at two opposite ends thereof is provided for connecting to the socket of each of circuit boards.

11. The circuit module system according to claim 1, further comprising at least one bridging plate, a bottom surface of the bridging plate being concaved to form two bridging chutes parallelly, a top surface of the bridging plate protruding two bridging sliders parallelly, each of the bridging sliders being corresponding to each of the bridging chutes, each of the bridging sliders sliding in chutes of two adjacent circuit modules, each of the bridging chutes being provided for two sliders of two circuit modules to slide thereon, the first circuit module and the second circuit module, or the first circuit module and the another first circuit module, or even the second circuit module and the another second circuit module connecting to each other laterally.

12. The circuit module system according to claim 11, wherein the first circuit board and the second circuit board are provided with a socket respectively, a cable having two plugs at two opposite ends thereof is provided for connecting to the socket of each of circuit boards.

* * * * *